(12) United States Patent
Graydon et al.

(10) Patent No.: US 7,782,629 B2
(45) Date of Patent: Aug. 24, 2010

(54) EMBEDDING AN ELECTRONIC COMPONENT BETWEEN SURFACES OF A PRINTED CIRCUIT BOARD

(75) Inventors: Bhret Graydon, San Jose, CA (US); William Kuang-Hua Shu, Sunnyvale, CA (US)

(73) Assignee: Flextronics AP, LLC, Broomfield, CO (US)

( * ) Notice: Subject to any disclaimer, the term of this patent is extended or adjusted under 35 U.S.C. 154(b) by 470 days.

(21) Appl. No.: 11/828,196

(22) Filed: Jul. 25, 2007

(65) Prior Publication Data

US 2008/0202799 A1    Aug. 28, 2008

Related U.S. Application Data

(60) Provisional application No. 60/891,660, filed on Feb. 26, 2007.

(51) Int. Cl.
*H05K 1/18* (2006.01)
(52) U.S. Cl. ............... 361/761; 361/760; 361/763; 361/766; 361/782; 174/262; 174/265
(58) Field of Classification Search ............ 174/262, 174/260, 261, 263, 259, 264–266; 361/738, 361/760, 761, 763, 766, 782, 748, 271, 821, 361/830

See application file for complete search history.

(56) References Cited

U.S. PATENT DOCUMENTS

| 5,281,152 | A |   | 1/1994 | Takahashi et al. |         |
|-----------|---|---|--------|------------------|---------|
| 5,547,530 | A |   | 8/1996 | Nakamura et al.  |         |
| 6,621,012 | B2|   | 9/2003 | Crockett et al.  |         |
| 6,806,428 | B1| * |10/2004 | Kimura et al.    | 174/260 |
| 6,809,268 | B2| * |10/2004 | Hayashi et al.   | 174/260 |

* cited by examiner

*Primary Examiner*—Dameon E Levi
*Assistant Examiner*—Hoa C Nguyen
(74) *Attorney, Agent, or Firm*—Robert G. Crouch; Karl A. Dierenbach; Marsh Fischmann & Breyfogle LLP

(57) ABSTRACT

A pre-drilled hole, providing a passageway between an upper and a lower surface of a printed circuit board layer, receives a passive component, for example a resistor or a capacitor. In one embodiment the component is cylindrical, with an electrically conductive contact point at each end. The hole diameter is approximately the same as the diameter of the cylindrical component. The hole is similar to a via in a printed circuit board, except that the hole is not plated through (such would cause an electrical short). Electrically conductive lines are provided to the openings of the hole on the upper and the lower surfaces of the PCB. The area of the exposed end of the cylindrical component and the termination of the conducting line is less than the area of a surface mounted component equivalent to the cylindrical component. In some embodiments the hole and inserted component are located directly below a pin pad for a surface mounted device, for example an integrated circuit, providing the equivalent of zero wire and line lengths with no net increase in printed circuit board area.

19 Claims, 3 Drawing Sheets

SINGLE LAYER, UNDER PIN

THREE OR MORE LAYERS

TWO LAYERS

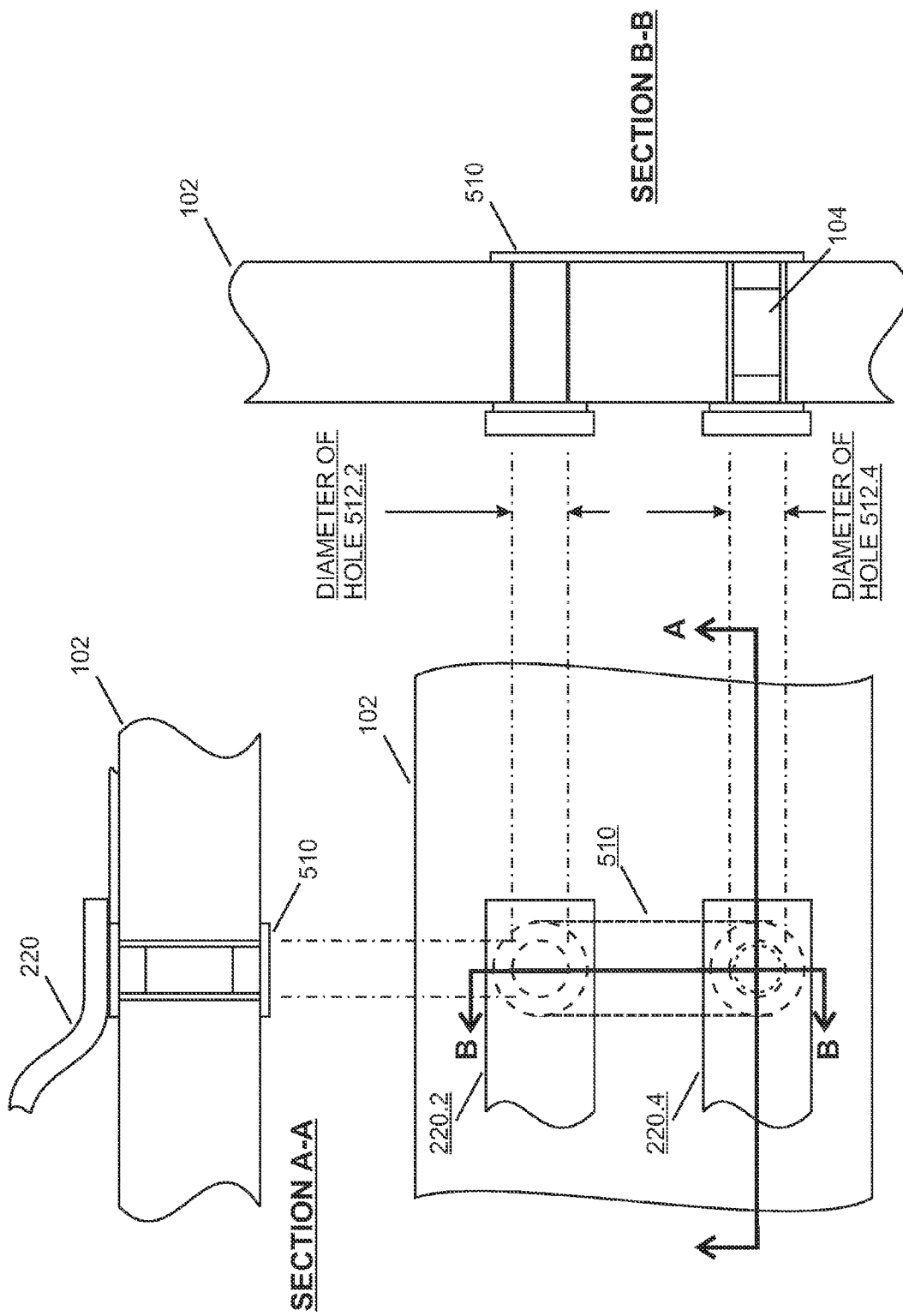

EMBEDDING AN ELECTRONIC COMPONENT BETWEEN SURFACES OF A PRINTED CIRCUIT BOARD

CROSS REFERENCE TO RELATED APPLICATIONS

This application claims priority from U.S. Provisional Application No. 60/891,660 entitled "ATTACHING PASSIVE COMPONENTS BETWEEN LAYERS OF A PCB," filed on 26 Feb. 2007, by B. Graydon and W. Shu, which is incorporated herein by reference.

BACKGROUND

In the manufacture of electronic products, great value is placed upon cost savings, physical size and weight savings, and electrical performance. Amongst other factors, the cost of an electronic product or subsystem is related to the area of a printed circuit board ("PCB" upon which components are mounted, whether for electrical connection or mechanical operation. The size and weight of the end product being manufactured are related to the number and size of the one or more PCBs forming the product or subsystem. Electrical performance is related to the length of signal lines between electrical components, the distance between an electrical component and the power source for the component, the distance between the power and ground pads on an electrical component and the noise filtering components to the power and ground inputs, and other factors.

Noise filtering (often termed "decoupling" of the power and ground terminals of an electronic component in the current art requires incremental PCB area corresponding to each added passive component and the interconnect to the passive component(s). The effectiveness of decoupling capacitors in filtering power line noise may be improved by short distances between the power and ground input terminals and the decoupling capacitor. Short distances between the power and ground input terminals also minimizes parasitic inductance, diminishing any ringing.

In addition to use in decoupling, passive components, such as capacitors and resistors, may be affixed elsewhere on the substrate, appropriately connected electrically to connection points, the electrical connection points being connected electrically to other connection points by electrically conductive lines. External components and their associated connectors and conducting lines add incrementally to the area required for a PCB to implement a system level electronic design.

In the relevant art, footprint area is sometimes decreased by using the smallest surface mount devices ("SMD" possible, using packaging that combines several passives into one package, and making cost/area/performance tradeoffs by eliminating passives that, while they may improve the quality of the electronic design, are not strictly required. In some cases electronic design is sub-optimized by eliminating some passives due to footprint constraints.

Current construction methods require additional footprint area as components external to an integrated circuit or a semiconductor die are added. It may not be possible, due to mechanical or area constraints or simply too many components, to place all of them optimally, the physical implementation thereby compromising the quality of the electronic deign.

What is needed is a method for providing electronic components wherein the components are optimally placed, requiring little or no additional area upon the system printed circuit board or substrate.

SUMMARY

A pre-drilled hole provides a passageway between an upper and a lower surface of a printed circuit board layer. The passageway receives a passive component, for example a resistor or a capacitor. In one embodiment the component is cylindrical, with an electrically conductive terminal at each end. The hole diameter is approximately the same as the diameter of the cylindrical component. The hole is similar to a via in a printed circuit board, except that the hole is not plated through (such would cause an electrical short). Electrically conductive lines are provided to the openings of the hole on the upper and the lower surfaces of the PCB. The area of the exposed end of the cylindrical component and the termination of the conducting line is less than the area of a surface mounted component equivalent to the cylindrical component. In some embodiments the hole and inserted component are located directly below a pin pad for a surface mounted device, for example an integrated circuit, providing the equivalent of zero wire and line lengths with no net increase in printed circuit board area.

BRIEF DESCRIPTION OF THE DRAWINGS

FIG. 5 shows a component electrically connected between two pins of a packaged electronic component.

DETAILED DESCRIPTION

Figure 1:
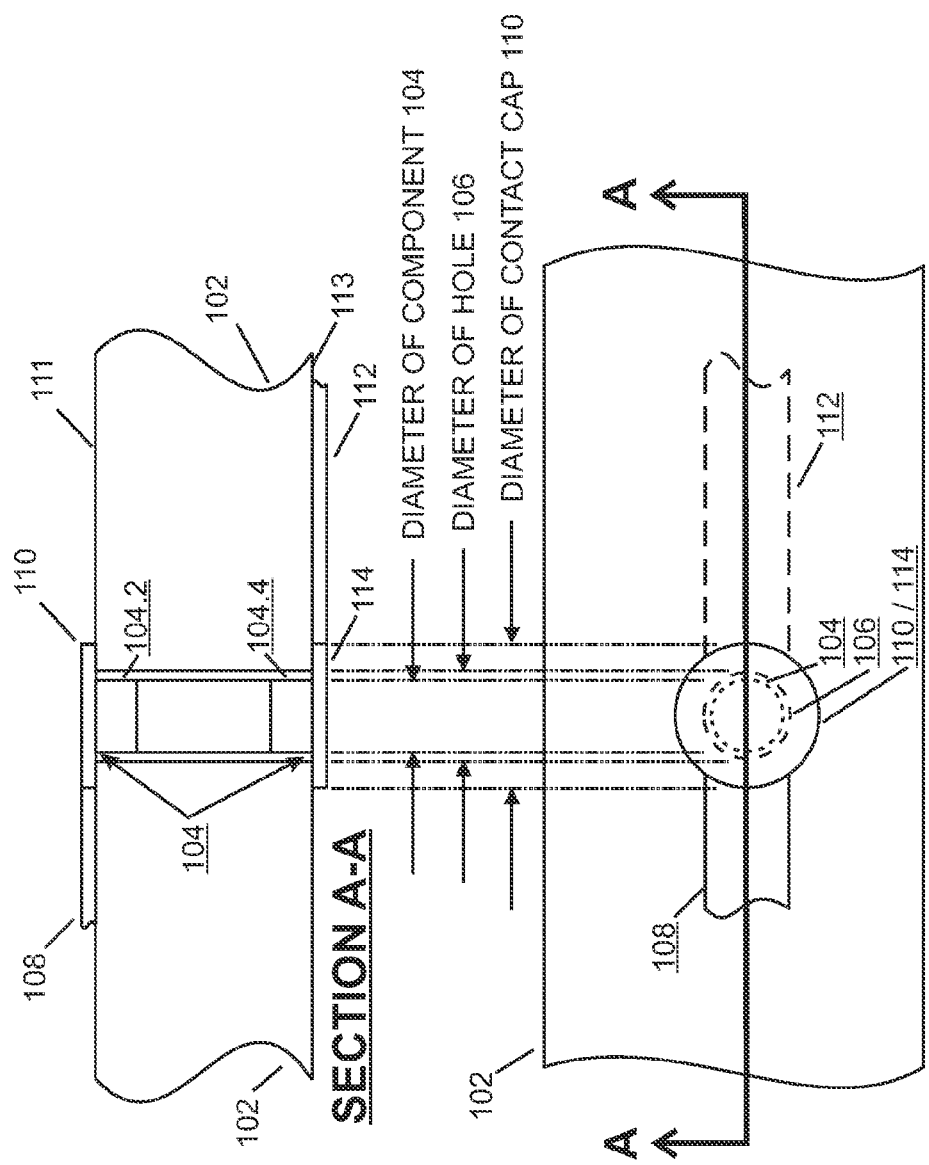
FIG. 1 shows a cross section of a printed circuit board layer wherein a component is embedded between a top and a bottom surface of the printed circuit board layer.

| Definition of terms: | |
|---|---|
| PCB | Printed circuit board. In the context of this disclosure, may also refer to "substrate". |
| Footprint | The area of a PCB covered by an individual component attached to the PCB. |
| SMD | Surface mount device; an electrical component that is mounted directly upon a conducting surface as opposed to a wire lead in a receiving hole. |
| IR | Infrared energy, often used for reflowing solder paste. |

The embodiments described in this section illustrate but do not limit the invention. The invention is not limited to any particular circuitry, semiconductor process, attachment technique, external component type, electrically conductive material, other parameters.

A printed circuit board or substrate ("printed circuit board", "PCB", and "substrate" are used interchangeably throughout this disclosure) is manufactured with one or more holes drilled completely through the PCB at certain predetermined locations. Certain of the holes are for the purpose of receiving an electrical component. The diameter of certain holes is selected such that the holes may later receive a cylindrical passive component. The passive component includes an electrically conductive contact terminal at each end. The thickness of the PCB and the length of the cylindrical passive component may be approximately the same. Electrically conductive lines connect to the terminating ends of the holes. In use, the electrically conductive lines carry signals to or from the terminals of the component. The top and bottom end of each hole is encircled with an electrically conductive material as part of the fabrication process of the PCB. During manufacture of the system assembled upon the PCB, a cylindrical component is inserted into each of the certain holes. The component is positioned in a hole such that the ends (terminals) of the component are approximately flush with the corresponding surface of the PCB. In one embodiment, solder paste is applied to each end of each component after the component has been inserted into a receiving hole, the solder paste also covering at least a portion of an electrically conductive material encircling the hole. A reflow process, for example IR heating, mechanically and electrically connects each end of each component with the corresponding surrounding electrically conductive material. The resulting connection is connected to other connection points by electrically conductive leads.

In the provided drawings, the elements of a structure will be described from top to bottom with the substrate oriented horizontally as shown. It should be understood, however, that the structure of this invention will be oriented in an arbitrary direction when placed into an application. Therefore, all references to top and bottom surfaces or structures in any of the drawings associated with this disclosure is to be understood to refer only to these surfaces and structures as oriented in the drawings and not in the context of the use of this structure.

FIG. 1 shows the structure of one embodiment of this invention. A PCB 102 is manufactured with a hole 106, the hole 106 extending from the top surface 111 to the bottom surface 113 of the PCB 102. Conductive rings 110, 114 encircle the hole 106 on the top 111 and the bottom surface 113, respectively, of the PCB 102. At the time of forming the rings 110, 114 the PCB is patterned with metal interconnecting lines 108, 112 for carrying a signal between a component 104 and other elements of the finished PCB assembly. When a ring 110, 114 and a component end 104.2, 104.4 are electrically connected, the combination is denominated a "contact" or "connection point."

The structure of FIG. 1 is constructed using a sequence of steps. In an exemplary method, the steps comprise:

1. Fabricate a PCB, including a conducting layer on the top and bottom surfaces of the PCB, with one or more holes, the size of each hole selected to correspond to the diameter of a component selected for insertion into a corresponding hole.
2. Pattern the conductive layer of the PCB to provide a conductive region around each hole, one region around each end of each hole.
3. Pattern the conductive layer of the PCB to provide leads for carrying a signal or signals to the region surrounding each hole.
4. Insert a corresponding component into each PCB hole wherein the top and bottom of the component is approximately flush with the top and bottom surfaces of the PCB.
5. Apply solder paste to each end of each component, the solder paste also applied to at least a portion of each region surrounding a component.
6. Reflow the PCB, component, solder paste assembly.

In one embodiment steps 2 and 3 are performed as one process step.

Alternative embodiments of the structure of FIG. 1 are sometimes used. For example, in some embodiments electrically conductive lead 108 or 112 is formed from conductive ink, copper, gold plated copper, or conductive rubber. In one embodiment the hole 106 and the component 104 are not round or cylindrical. For example, a rectangular punch may form a passage suitable for receiving a SMC passive component that is also rectangular in cross section. In some embodiments the electrically conductive region 110 and/or 114 are a material other than metal, for example conductive ink. In such embodiments the process steps described earlier are modified by not applying solder paste to the conductive region surrounding a hole wherein metal is not provided.

In one embodiment, a passive component is shorter than the corresponding PCB thickness. A filler in the hole is used to make up the difference in length after the component has been placed into the hole. The filler may be additional solder paste, conductive ink, a metal plug, or a solder plug. In some embodiments the component is held in place by reflowed solder paste on one end and conductive ink applied to the component and the region surrounding the hole at the other end. Sometimes conductive ink is used for a conductive lead to enable selective circuit connections for configuration at the end of the process line. All combinations of these and other materials and process steps known to one skilled in the art are part of the invention.

Figure 4:
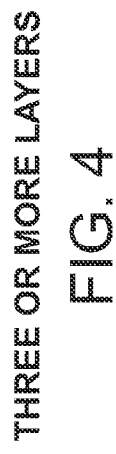
FIG. 4 shows a component embedded in a center PCB layer wherein both surfaces of the center PCB layer are covered by one or more additional PCB layers.

The structure of FIG. 1 may be extended in other ways. In the other structures the component, electrically surrounding regions and electrically conductive leads are formed in a manner similar to the process previously disclosed and are not repeated here. For example, in FIG. 2 a component 104 is embedded under a pin 220 of a surface mount device, for example an integrated circuit. FIG. 3 shows a structure wherein a component 104 is installed in a two-layer PCB sandwich. The component 104 is embedded in a top PCB layer 302. This may be done before a bottom PCB layer 303 is affixed to the top PCB layer 302. The structure of FIG. 4 is similar to the structure of FIG. 3, with one or more top PCB layers 404 and one or more bottom layers 403 covering the PCB layer 402 in which the component 104 is embedded.

Figure 2:
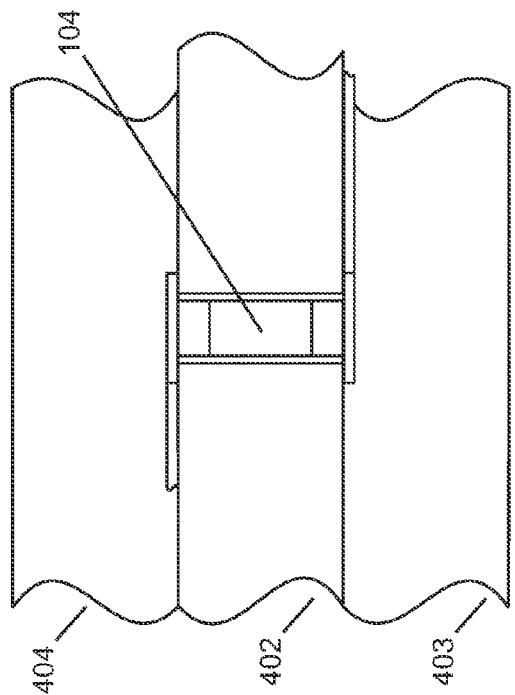
FIG. 2 shows a component embedded directly below a pin pad for an SMD packaged electronic component.
Figure 3:
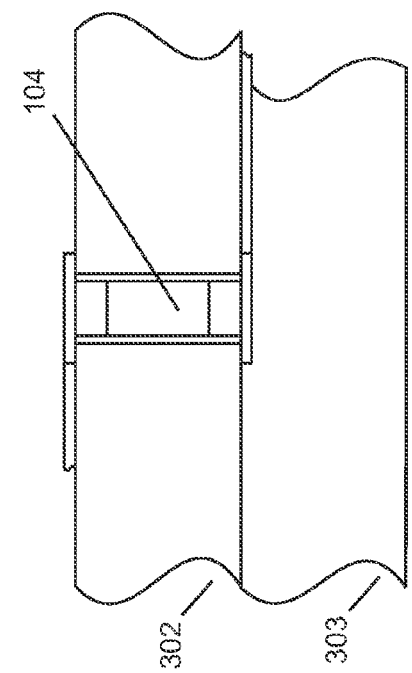
FIG. 3 shows one end of a component connected to a top (exposed) surface of a PCB layer and the other end of the component connected to an electrically connected line, the line covered by a second PCB layer.

By way of illustration of the use of the embodiment of FIG. 2, we look to FIG. 5. In this example, two holes 512.2 and 512.4 are preformed directly under two pins 220.2 and 220.4 of a surface mounted integrated circuit. A component 104, for example a decoupling capacitor, is embedded in hole 512.4. An electrically conductive lead 510 connects the lower (as shown in FIG. 5 Section A-A) end of hole 512.4 to the lower end of hole 512.2. Hole 512.2, unlike the holes disclosed earlier to hold a component such as component 104, is plated through to provide an electrical connection between the electrically conducting lead 510 and pin 220.2. Other elements of the structure, such as the electrically conducting regions around the holes and other electrically conducting leads are similar to those described earlier and are not repeated here. In one embodiment both hole 512.2 and hold 512.4 have components 104 embedded, to provide capacitance or resistance in series or to allow a connection (not shown) to electrically conducting lead 510.

Often a system designer must take care to match the lengths of related signal lines. A system constructed as described herein provides for minimum wire lengths, which translates into minimum inductance, so that matching signal lines is less of a concern.

Reservation of Extra-Patent Rights, Resolution of Conflicts, and Interpretation of Terms If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

Given the above disclosure of general concepts and specific embodiments, the scope of protection sought is to be defined by the claims appended hereto. The issued claims are not to be taken as limiting Applicant's right to claims disclosed, but not yet literally claimed subject matter by way of one or more further applications including those filed pursuant to 35 U.S.C. §120 and/or 35 U.S.C. §251.

Unless expressly stated otherwise herein, ordinary terms have their corresponding ordinary meanings within the respective contexts of their presentations, and ordinary terms of art have their corresponding regular meanings

What is claimed is:

1. An electronic structure, comprising:
    a first substrate, the first substrate including a first and a second surface wherein said surfaces are approximately parallel to each other and wherein the separation distance between the first and the second surface defines a thickness of the first substrate, the first substrate further including a passageway for receiving an electronic component, the passageway extending from the first surface to the second surface, and wherein the first substrate further includes electrical conducting material around at least a portion of the passageway at the first and at the second surface;
    an electronic component of approximately the same length as or less than the thickness of the first substrate wherein the cross section of the electrical component approximates that of the passageway and wherein the electronic component includes a first terminating electrical contact at a first end of the electronic component and a second terminating electrical contact at a second end of the electronic component, wherein the electronic component is disposed within the passageway; and
    a continuous portion of solder mechanically and electrically connecting the first terminating electrical contact to the electrical conducting material around the passageway at the first surface, wherein the continuous portion of solder is in direct contact with both the first terminating electrical contact and the electrical conducting material around the passageway at the first surface.

2. The structure of claim 1, wherein the passageway is cylindrical.

3. The structure of claim 1, further including a second substrate including a surface wherein the surface of the second substrate is attached to the first or the second surface of the first substrate thereby forming a laminar structure wherein the second substrate covers one of the first and second terminating electrical contacts.

4. The structure of claim 3, further including a third substrate including a surface wherein the surface of the third substrate is attached to the first or the second surface of the first substrate thereby forming a laminar structure wherein the first and second terminating electrical contacts are covered by the second substrate and the third substrate.

5. The structure of claim 1 wherein the first substrate comprises a printed circuit board.

6. The structure of claim 1 wherein the first substrate comprises a ceramic material.

7. The structure of claim 1 wherein the electronic component is a passive electrical component.

8. An electronic structure, comprising:
    a substrate, the substrate including a first and a second surface wherein the first and second surfaces are approximately parallel to each other, wherein the separation distance between the first and the second surface defines a thickness of the substrate, the substrate further including a first passageway for receiving an electronic component, the first passageway extending from the first surface to the second surface;
    first electrical conducting material on the first surface around at least a portion of the first passageway;
    second electrical conducting material on the second surface around at least a portion of the first passageway;
    an electronic component of the same length as or less than the thickness of the substrate, wherein the cross section of the electrical component approximates that of the first passageway, wherein the electronic component includes a first terminating electrical contact at a first end of the electronic component and a second terminating electrical contact at a second end of the electronic component, wherein the electronic component is disposed within the first passageway;
    a first continuous portion of electrical conducting material electrically connecting the first terminating electrical contact to the first electrical conducting material, wherein the first continuous portion of electrical conducting material is in direct contact with both the first terminating electrical contact and the first electrical conducting material; and
    a surface mounted electronic component, wherein a first connector of the surface mounted electronic component is in direct contact with the first continuous portion of electrical conducting material, wherein the surface mounted electronic component is disposed on the first surface of the substrate, wherein the first passageway is located under the first connector of the surface mounted electronic component.

9. The structure of claim 8, wherein the electronic component is a capacitor, wherein the surface mounted electronic component is an integrated circuit, wherein the first connector of the surface mounted electronic component is a pin comprising a first pin portion disposed parallel to the first surface and a second pin portion extending away from the first surface, wherein the first passageway is located under the first pin portion, wherein the first passageway is not located under the second pin portion.

10. The structure of claim 9, wherein the substrate further includes a second passageway extending from the first surface to the second surface, wherein the second passageway is located under a second connector of the surface mounted electronic component, wherein the first and second passageways are electrically interconnected to each other by an electrically conductive lead extending directly from the first passageway to the second passageway along the second surface.

11. A method for making an electronic structure, the method comprising:
    providing a first substrate, the first substrate including a first and a second surface wherein said surfaces are approximately parallel to each other and wherein the separation distance between the first and the second surface define a thickness of the first substrate, the first substrate further including a passageway for receiving an electronic component, the passageway extending from the first surface to the second surface, and wherein the first substrate further includes first electrical conducting material around at least a portion of the passageway at the first surface and second electrical conducting material around at least a portion of the passageway at the second surface;

providing an electronic component of approximately the same length as or less than the thickness of the first substrate wherein the cross section of the electrical component approximates that of the passageway and wherein the electronic component includes a first terminating electrical contact at a first end of the electronic component, wherein the electronic component includes a second terminating electrical contact at a second end of the electronic component;

inserting the electronic component into the passageway such that the first terminating electrical contact is approximately level with respect to the first surface of the first substrate and the second terminating electrical contact is approximately level with respect to the second surface of the first substrate;

applying a first continuous portion of solder paste such that the first continuous portion of solder paste contacts the first terminating electrical contact and the first electrical conducting material; and reflowing the first continuous portion of solder paste to mechanically and electrically connect the first terminating electrical contact to the first electrical conducting material.

12. A method as defined in claim 11, wherein the passageway is cylindrical.

13. A method as defined in claim 11, further comprising:
providing a second substrate, including a surface;
positioning the second substrate relative to the first substrate such that at least a portion of the second substrate covers a terminating end of the electronic component; and attaching the surface of the second substrate to the first or the second surface of the first substrate thereby forming a laminar structure.

14. A method as defined in claim 13, further comprising:
providing a third substrate, including a surface;
positioning the third substrate relative to the first substrate such that at least a portion of the third substrate covers a terminating end of the electronic component; and
attaching the surface of the third substrate to the first or the second surface of the first substrate thereby forming a laminar structure.

15. A method as defined in claim 11 wherein the first substrate comprises a printed circuit board.

16. A method as defined in claim 11 wherein the first substrate comprises a ceramic material.

17. A method as defined in claim 11 wherein the electronic component is a passive electrical component.

18. A method as defined in claim 11 further comprising:
placing a surface mounted electronic component on the first surface such that the passageway is located under a first connector of the surface mounted electronic component,
wherein the placing step is performed after the applying step and prior to the reflowing step.

19. A method as defined in claim 11 further comprising:
applying a second continuous portion of solder paste such that the second continuous portion of solder paste contacts the second terminating electrical contact and the second electrical conducting material; and
reflowing the second continuous portion of solder paste to mechanically and electrically connect the second terminating electrical contact to the second electrical conducting material.

* * * * *

UNITED STATES PATENT AND TRADEMARK OFFICE
CERTIFICATE OF CORRECTION

PATENT NO. : 7,782,629 B2  Page 1 of 1
APPLICATION NO. : 11/828196
DATED : August 24, 2010
INVENTOR(S) : Graydon et al.

It is certified that error appears in the above-identified patent and that said Letters Patent is hereby corrected as shown below:

Column 1, line 63, delete "deign" and insert therefor --design--.

Signed and Sealed this

Twelfth Day of October, 2010

David J. Kappos
*Director of the United States Patent and Trademark Office*